United States Patent
Kim et al.

(10) Patent No.: US 12,512,428 B2
(45) Date of Patent: Dec. 30, 2025

(54) SEMICONDUCTOR DEVICE AND METHOD OF FABRICATING THE SAME

(71) Applicant: Samsung Electronics Co., Ltd., Suwon-si (KR)

(72) Inventors: Jihoon Kim, Suwon-si (KR); Minki Kim, Suwon-si (KR); Wonil Lee, Suwon-si (KR); Hyuekjae Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 453 days.

(21) Appl. No.: 17/980,740

(22) Filed: Nov. 4, 2022

(65) Prior Publication Data

US 2023/0317654 A1  Oct. 5, 2023

(30) Foreign Application Priority Data

Mar. 31, 2022 (KR) .................. 10-2022-0040776

(51) Int. Cl.
*G06F 3/046* (2006.01)
*H01L 23/00* (2006.01)
(Continued)

(52) U.S. Cl.
CPC .............. *H01L 24/08* (2013.01); *H01L 24/05* (2013.01); *H01L 24/80* (2013.01); *H01L 25/0657* (2013.01); *H01L 25/18* (2013.01); *H01L 25/50* (2013.01); *H01L 2224/05013* (2013.01); *H01L 2224/05015* (2013.01); *H01L 2224/05017* (2013.01); *H01L 2224/05147* (2013.01); *H01L 2224/08145* (2013.01); *H01L 2224/80031* (2013.01); *H01L 2224/80895* (2013.01);
(Continued)

(58) Field of Classification Search
CPC ......... H01L 24/08; H01L 24/05; H01L 24/80; H01L 25/0657
See application file for complete search history.

(56) References Cited

U.S. PATENT DOCUMENTS 8,368,222 B2  2/2013 Okuyama
9,142,517 B2  9/2015 Liu et al.
(Continued)

FOREIGN PATENT DOCUMENTS

| JP | 2019047043 A | 3/2019 |
|---|---|---|
| KR | 10-2021-0008918 A | 1/2021 |
| KR | 10-2023-0077809 A | 6/2023 |

*Primary Examiner* — Thao P Le
(74) *Attorney, Agent, or Firm* — Fish & Richardson P.C.

(57) ABSTRACT

Disclosed are semiconductor devices and their fabrication methods. The semiconductor device comprises lower and upper structures. The lower structure includes a first semiconductor substrate, a first pad, and a first dielectric layer. The upper structure includes a second semiconductor substrate, a second pad, and a second dielectric layer. The upper and lower structures are bonded to each other to allow the first and second pads to come into contact each other and to allow the first and second dielectric layers to come into contact each other. A first interface between the first and second pads is at a level different from that of a second interface between the first and second dielectric layers. A first area of the first pad is greater than a second area of the second pad. A second thickness of the second pad is different from a first thickness of the first pad.

20 Claims, 12 Drawing Sheets

(51) Int. Cl.
  *H01L 25/00*   (2006.01)
  *H01L 25/065*  (2023.01)
  *H01L 25/18*   (2023.01)

(52) U.S. Cl.
  CPC ............. *H01L 2224/80896* (2013.01); *H01L 2924/1431* (2013.01); *H01L 2924/14511* (2013.01)

(56) References Cited

U.S. PATENT DOCUMENTS

| | | |
|---|---|---|
| 9,728,521 B2 | 8/2017 | Tsai et al. |
| 10,026,704 B2 | 7/2018 | Wu et al. |
| 11,031,285 B2 | 6/2021 | Katkar et al. |
| 11,848,293 B2 * | 12/2023 | Seo ................. H01L 24/16 |
| 11,862,613 B2 * | 1/2024 | Jang ................. H01L 24/73 |
| 2021/0043673 A1 | 2/2021 | Kwon et al. |
| 2021/0280545 A1 | 9/2021 | Watanabe |
| 2023/0163089 A1 | 5/2023 | Kim et al. |
| 2023/0215843 A1 * | 7/2023 | Park ................. H01L 25/0657 257/777 |
| 2024/0006272 A1 * | 1/2024 | Kim ................. H01L 23/49838 |
| 2024/0038728 A1 * | 2/2024 | Jang ................. H01L 23/544 |
| 2024/0055406 A1 * | 2/2024 | Kim ................. H01L 24/03 |
| 2024/0071951 A1 * | 2/2024 | Chang ................. H10B 80/00 |
| 2024/0170464 A1 * | 5/2024 | Jo ................. H01L 23/49822 |
| 2024/0203960 A1 * | 6/2024 | Lee ................. H01L 24/08 |
| 2024/0213143 A1 * | 6/2024 | Song ................. H01L 23/5223 |
| 2025/0105214 A1 * | 3/2025 | Shih ................. H01L 23/3107 |

* cited by examiner

SEMICONDUCTOR DEVICE AND METHOD OF FABRICATING THE SAME

CROSS-REFERENCE TO RELATED APPLICATION

This U.S. nonprovisional application claims priority under 35 U.S.C § 119 to Korean Patent Application No. 10-2022-0040776 filed on Mar. 31, 2022 in the Korean Intellectual Property Office, the disclosure of which is hereby incorporated by reference in its entirety.

BACKGROUND

1. Field

The present inventive concepts relate to a semiconductor device and a method of fabricating the same, and more particularly, to a directly bonded semiconductor device and a method of fabricating the same.

2. Description of the Related Art

In the semiconductor industry, high capacity, thinness, and small size of semiconductor devices and electronic products using the same have been demanded and thus various package techniques have been suggested. One approach of the various package techniques is a packaging technique which vertically stacks a plurality of semiconductor chips to achieve a high density chip stacking. This packaging technique has an advantage capable of integrating semiconductor chips having various functions on a smaller area than a conventional package consisting of one semiconductor chip.

A semiconductor package is provided to implement an integrated circuit chip to be suitable for use in electronic products. A semiconductor package is typically configured such that a semiconductor chip is mounted on a printed circuit board and bonding wires or bumps are used to electrically connect the semiconductor chip to the printed circuit board. With the development of the electronics industry, various research has been conducted to improve reliability and durability of semiconductor packages.

SUMMARY

Some example embodiments of the present inventive concepts provide a semiconductor device whose bonding reliability is increased and a method of fabricating the same.

Some example embodiments of the present inventive concepts provide a semiconductor device whose electrical properties are increased and a method of fabricating the same.

Some example embodiments of the present inventive concepts provide a method of fabricating a semiconductor device in which an occurrence of defects is reduced and a semiconductor device fabricated by the same.

According to some example embodiments of the present inventive concepts, a semiconductor device may comprise: a lower structure; and an upper structure. The lower structure may include: a first semiconductor substrate; a first pad on the first semiconductor substrate; and a first dielectric layer that surrounds the first pad on the first semiconductor substrate. The upper structure may include: a second semiconductor substrate; a second pad on the second semiconductor substrate; and a second dielectric layer that surrounds the second pad on the first semiconductor substrate. The upper structure and the lower structure may be bonded to each other to allow the first pad and the second pad to come into contact each other and to allow the first dielectric layer and the second dielectric layer to come into contact each other. A first interface between the first pad and the second pad may be at a level different from a level of a second interface between the first dielectric layer and the second dielectric layer. A first area of the first pad may be greater than a second area of the second pad. A second thickness of the second pad may be different from a first thickness of the first pad.

According to some example embodiments of the present inventive concepts, a semiconductor device may comprise: a lower structure including a first circuit pattern on a first substrate, a first dielectric layer that covers the first circuit pattern on the first substrate, and a first pad that is exposed on the first dielectric layer and is connected to the first circuit pattern; and an upper structure including a second circuit pattern on a second substrate, a second dielectric layer that covers the second circuit pattern on the second substrate, and a second pad that is exposed on the second dielectric layer and is connected to the second circuit pattern. A top surface of the first pad may have a recess directed toward the first substrate. A portion of the second pad may extend into the recess to come into contact with the first pad. The first pad and the second pad may constitute a single unitary body formed of the same material. A second thickness of the second pad may be greater than a first thickness of the first pad.

According to some example embodiments of the present inventive concepts, a method of fabricating a semiconductor device may comprise: proving a lower structure that includes a first semiconductor substrate, a first pad on the first semiconductor substrate, and a first dielectric layer surrounding the first pad on the first semiconductor substrate; performing a planarization process on the first pad and the first dielectric layer, a recess being formed on a top surface of the first pad after the planarization process, the recess being at a level lower than a level of a top surface of the first dielectric layer; proving an upper structure that includes a second semiconductor substrate, a second pad on the second semiconductor substrate, and a second dielectric layer surrounding the second pad on the second semiconductor substrate; causing the upper structure and the lower structure to contact each other to allow the first pad and the second pad to vertically align with each other and to allow the first dielectric layer and the second dielectric layer to be coupled to each other; and performing an annealing process on the upper structure and the lower structure. During the annealing process, the second pad may expand toward the first pad so as to fill the recess, and the second pad and the first pad may be brought into contact and bonded to each other.

DETAIL PARTED DESCRIPTION OF EMBODIMENTS

The following will now describe a semiconductor device according to some example embodiments of the present inventive concepts with reference to accompanying drawings.

Figure 1:
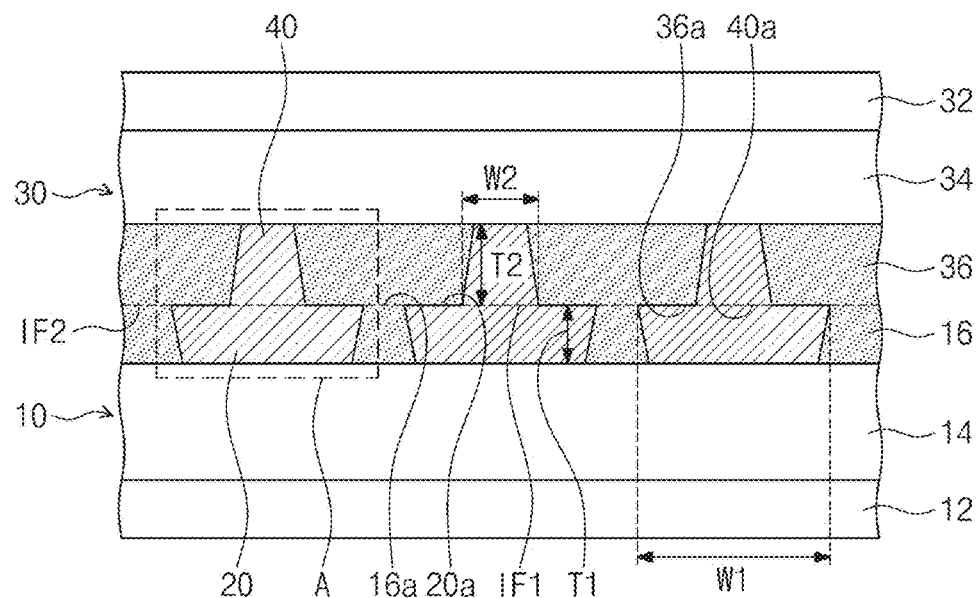
FIGS. 1 and 2 illustrate cross-sectional views showing a semiconductor device according to some example embodiments of the present inventive concepts.
Figure 2:
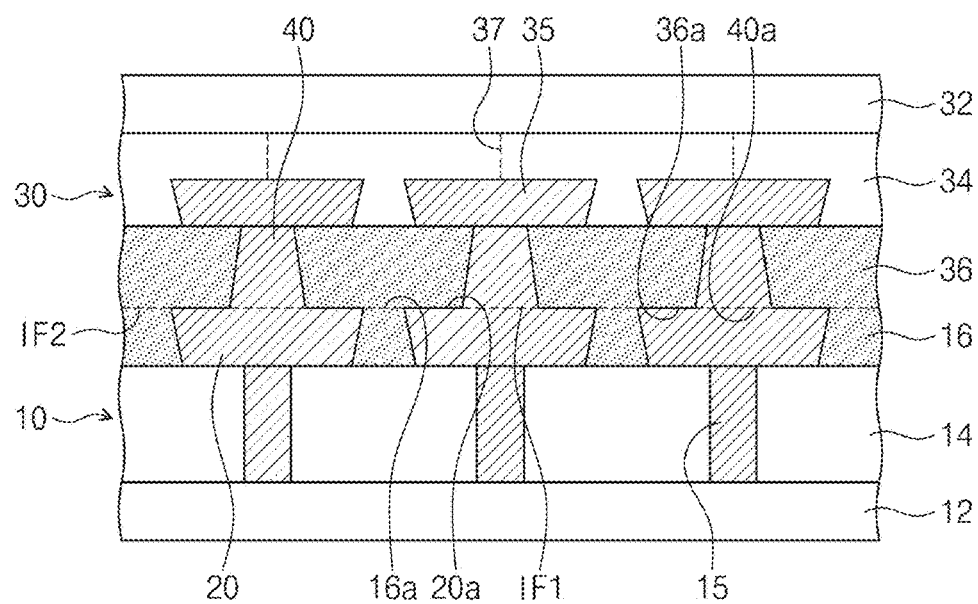
Figure 3:
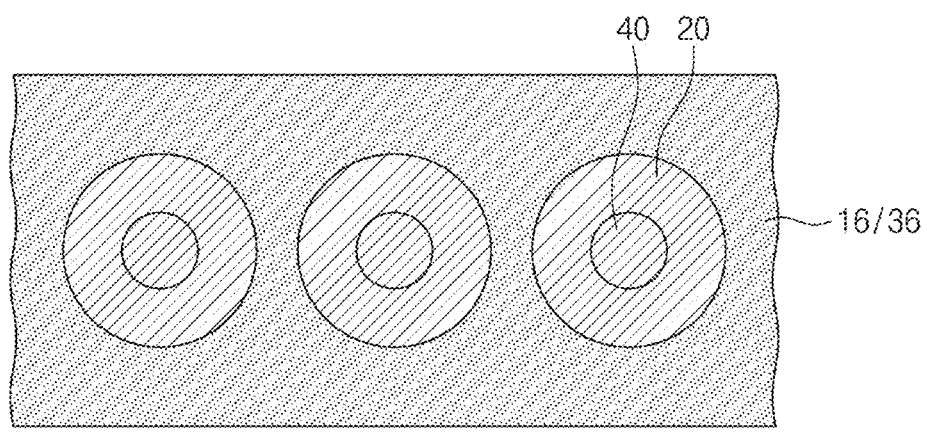
FIGS. 3 and 4 illustrate plan views showing a semiconductor device according to some example embodiments of the present inventive concepts.
Figure 4:
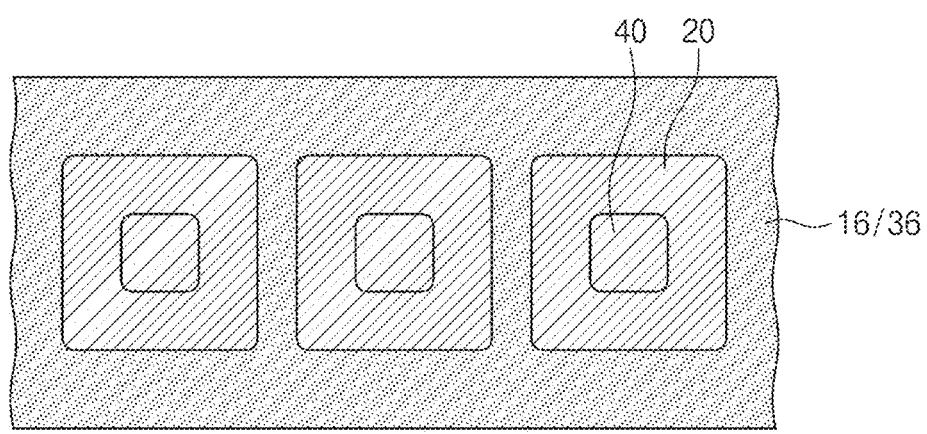
Figure 5:
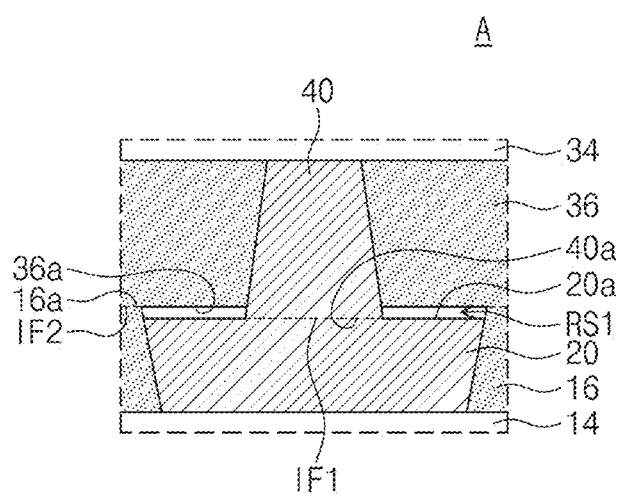
FIGS. 5 and 6 illustrate enlarged views showing section A of FIG. 1.
Figure 6:
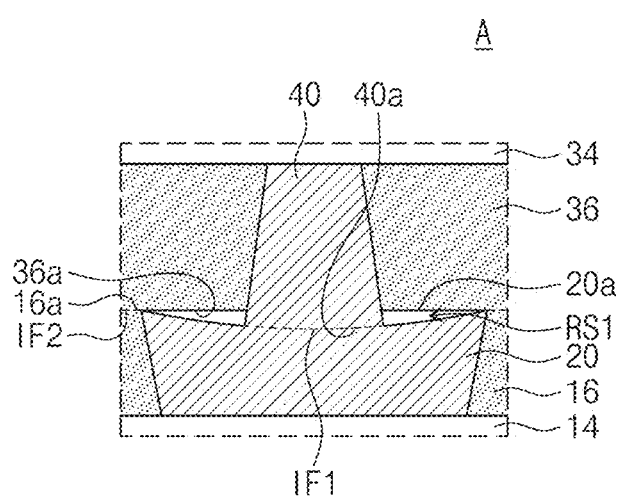

FIGS. 1 and 2 illustrate cross-sectional views showing a semiconductor device according to some example embodiments of the present inventive concepts. FIGS. 3 and 4 illustrate plan views showing the semiconductor device of FIG. 1 according to some example embodiments of the present inventive concepts. FIGS. 5 and 6 illustrate enlarged views showing section A of FIG. 1.

Referring to FIG. 1, a semiconductor device may include a lower structure 10 and an upper structure 30 stacked on the lower structure 10.

The lower structure 10 may include a first substrate 12, a first circuit layer 14, a first dielectric layer 16, and first pads 20.

The first substrate 12 may be a semiconductor substrate such as a semiconductor wafer. The first substrate 12 may be a bulk silicon substrate, a silicon-on-insulator (SOI) substrate, a germanium substrate, a germanium-on-insulator (GOI) substrate, a silicon-germanium substrate, or an epitaxial layer substrate obtained by performing selective epitaxial growth (SEG). The first substrate 12 may include, for example, at least one selected from silicon (Si), germanium (Ge), silicon germanium (SiGe), gallium arsenic (GaAs), indium gallium arsenic (InGaAs), aluminum gallium arsenic (AlGaAs), and a mixture thereof. Alternatively, the first substrate 12 may be a dielectric substrate.

The first circuit layer 14 may be provided on the first substrate 12. The first circuit layer 14 may include a first circuit pattern on the first substrate 12 and a dielectric layer that covers the first circuit pattern. The first circuit pattern may be a memory circuit, a logic circuit, or a combination thereof, and any of these circuits may include one or more transistors. Alternatively, the first circuit pattern may include a passive element, such as a resistor or a capacitor.

The first pads 20 may be disposed on the first circuit layer 14. The first pads 20 may include metal. For example, the first pads 20 may include copper (Cu). The first pad 20 may have a damascene structure. For example, the first pad 20 may further include one of a seed layer and a barrier layer each of which covers lateral and bottom surfaces of the first pad 20. The first pad 20 may have a width that decreases with decreasing distance from the first substrate 12. Differently from that shown, the first pad 20 may have a T-shaped cross-section that includes a via part and a pad part on the via part, which via and pad parts are integrally connected into a single unitary body.

The first pads 20 may be electrically connected to the first circuit pattern of the first circuit layer 14. For example, as shown in FIG. 2, a first connection line 15 may be provided in the first circuit layer 14. The first connection line 15 may be a through via that vertically penetrates a dielectric pattern in the first circuit layer 14. The first connection line 15 may vertically extend in the first circuit layer 14 to be coupled to the first pads 20. The first connection line 15 may electrically connect the first circuit pattern to the first pads 20. Although not shown in FIG. 2, various conductive patterns may be provided for connection between the first circuit pattern and the first connection line 15. Differently from that shown in FIG. 2, the first connection line 15 may be an under pad pattern or a redistribution pattern provided in a dielectric pattern in the first circuit layer 14. In this case, various conductive patterns may be provided for connection between the first circuit pattern and the first connection line 15. The present inventive concepts, however, are not limited thereto, and if necessary, the first circuit layer 14 may be provided in diverse shapes, and connection between the first pads 20 and the first circuit layer 14 may be achieved through various configurations.

The first dielectric layer 16 may be disposed on the first circuit layer 14. On the first circuit layer 14, the first dielectric layer 16 may surround the first pads 20. The first dielectric layer 16 may expose top surfaces 20a of the first pads 20. The first dielectric layer 16 may have a top surface 16a coplanar with the top surfaces 20a of the first pads 20. The first dielectric layer 16 may include a dielectric material, such as silicon oxide (SiO), silicon nitride (SiN), or silicon carbonitride (SiCN).

The upper structure 30 may include a second substrate 32, a second circuit layer 34, a second dielectric layer 36, and second pads 40.

The second substrate 32 may be a semiconductor substrate such as a semiconductor wafer. The second substrate 32 may be a bulk silicon substrate, a silicon-on-insulator (SOI) substrate, a germanium substrate, a germanium-on-insulator (GOI) substrate, a silicon-germanium substrate, or an epitaxial layer substrate obtained by performing selective epitaxial growth (SEG). The second substrate 32 may include, for example, at least one selected from silicon (Si), germanium (Ge), silicon germanium (SiGe), gallium arsenic (GaAs), indium gallium arsenic (InGaAs), aluminum gallium arsenic (AlGaAs), and a mixture thereof. Alternatively, the second substrate 32 may be a dielectric substrate.

The second circuit layer 34 may be provided on the second substrate 32. The second circuit layer 34 may include a second circuit pattern on the second substrate 32 and a dielectric layer that covers the second circuit pattern. The second circuit pattern may be a memory circuit, a logic circuit, or a combination thereof, and any of these circuits may include one or more transistors. Alternatively, the second circuit pattern may include a passive element, such as a resistor or a capacitor.

The second pads 40 may be disposed on the second circuit layer 34. The second pads 40 may include metal. For example, the second pads 40 may include copper (Cu). The second pad 40 may have a damascene structure. For example, the second pad 40 may further include one of a seed layer and a barrier layer each of which covers lateral and bottom surfaces of the second pad 40. The second pad 40 may have a width that decreases with decreasing distance from the second substrate 32. Differently from that shown, the second pad 40 may have a T-shaped cross-section that includes a via part and a pad part on the via part, which via and pad parts are integrally connected into a single unitary body.

The second pads 40 may be electrically connected to the second circuit pattern of the second circuit layer 34. For example, as shown in FIG. 2, a second connection line 35 may be provided in the second circuit layer 34. The second connection line 35 may be an under pad pattern or a redistribution pattern provided in a dielectric pattern in the second circuit layer 34. The second connection line 35 may vertically extend in the second circuit layer 34 to be coupled to the second pads 40. The second connection line 35 may electrically connect the second circuit pattern to the second pads 40. Although simply illustrated in FIG. 2, various conductive patterns 37 may be provided for connection between the second circuit pattern and the second connection line 35. Differently from that shown, the second connection line 35 may be a through via that vertically penetrates a dielectric pattern in the second circuit layer 34. The present inventive concepts, however, are not limited thereto, and if necessary, the second circuit layer 34 may be provided in diverse shapes, and connection between the second pads 40 and the second circuit layer 34 may be achieved through various configurations.

The second dielectric layer 36 may be disposed on the second circuit layer 34. On the second circuit layer 34, the second dielectric layer 36 may surround the second pads 40. The second dielectric layer 36 may expose bottom surfaces 40a of the second pads 40. The second dielectric layer 36 may have a bottom surface 36a coplanar with the bottom surfaces 40a of the second pads 40. The second dielectric layer 36 may include a dielectric material, such as silicon oxide (SiO), silicon nitride (SiN), or silicon carbonitride (SiCN).

Referring to FIGS. 1 and 3, there may be disposed the lower structure 10 and the upper structure 30. The first pads 20 of the lower structure 10 may be vertically aligned with the second pads 40 of the upper structure 30. The lower structure 10 and the upper structure 30 may be brought into contact with each other to allow the first pads 20 and the second pads 40 to connect to each other.

The first dielectric layer 16 of the lower structure 10 and the second dielectric layer 36 of the upper structure 30 may be bonded to each other at an interface between the lower structure 10 and the upper structure 30. In this case, the first dielectric layer 16 and the second dielectric layer 36 may constitute an oxide, nitride, or oxynitride hybrid bonding. In this description, the term "hybrid bonding" may denote a bonding in which two components of the same kind are merged at an interface therebetween. The first dielectric layer 16 and the second dielectric layer 36 that are bonded to each other may have a continuous configuration, and an invisible interface may be provided between the first dielectric layer 16 and the second dielectric layer 36. For example, the first dielectric layer 16 and the second dielectric layer 36 may be formed of the same material, and no interface may be present between the first dielectric layer 16 and the second dielectric layer 36. In this sense, the first dielectric layer 16 and the second dielectric layer 36 may be provided in the form of one component. Thus, the first dielectric layer 16 and the second dielectric layer 36 may be bonded to constitute a single unitary body. The present inventive concepts, however, are not limited thereto. The first dielectric layer 16 and the second dielectric layers 36 may be formed of different materials from each other. The first dielectric layer 16 and the second dielectric layer 36 may not have a continuous configuration, and a visible interface may be provided between the first dielectric layer 16 and the second dielectric layer 36. The first dielectric layer 16 and the second dielectric layer 36 may not be combined with each other, and may each be provided in the form of a separate component. The following description will focus on the embodiment of FIGS. 1 and 3.

The upper structure 30 may be connected to the lower structure 10. For example, the lower structure 10 and the upper structure 30 may be brought into contact with each other. The first pads 20 of the lower structure 10 and the second pads 40 of the upper structure 30 may be bonded to each other at an interface between the lower structure 10 and the upper structure 30. In this case, the first pad 20 and the second pads 40 may constitute an intermetallic hybrid bonding. The first pad 20 and the second pad 40 that are bonded to each other may have a continuous configuration, and an invisible interface may be provided between the first pads 20 and the second pads 40. For example, the first pads 20 and the second pads 40 may be formed of the same material, and no interface may be present between the first pads 20 and the second pads 40. In this sense, the first pads 20 and the second pads 20 and 40 may be provided in the form of one component. Thus, the first pads 20 and the second pads 40 may be bonded to constitute a single unitary body. The following will focus on an example in which a single first pad 20 and a single second pad 40 are used to describe in detail connection between the first pads 20 and the second pads 40.

A first width W1 of the first pad 20 may be greater than a second width W2 of the second pad 40. In this description, a horizontal distance of the first pad 20 is called the first width W1 and a horizontal distance of the second pad 40 is called the second width W2, but based on planar shapes of the first pad 20 and the second pad 40, the horizontal distance of the first pad 20 is called a first diameter and the horizontal distance of the second pad 40 is called a second diameter. The first width W1 of the first pad 20 or the second width W2 of the second pad 40 may range from about 2 μm to about 30 μm. The present example inventive concepts, however, are not limited thereto.

A planar shape of the first pad 20 may be larger than that of the second pad 40. A first area of the first pad 20 may be greater than a second area of the second pad 40, and when viewed in a plan view, the second pad 40 may be positioned within the first pad 20. For example, when viewed in a plan view, an entirety of the second pad 40 may overlap at least a portion of the first pad 20. The first area of the first pad 20 may be about 1.5 times to about 2 times the second area of the second pad 40. As shown in FIG. 3, each of the first and second pads 20 and 40 may have a circular planar shape. Alternatively, as shown in FIG. 4, each of the first and second pads 20 and 40 may have a square or other polygonal planar shape. The present inventive concepts, however, are not limited thereto, and if necessary, each of the first and second pads 20 and 40 may be any other planar shape.

A first thickness T1 of the first pad 20 may be less than a second thickness T2 of the second pad 40. The second thickness T2 of the second pad 40 may be about 1.5 times to about 3 times the first thickness T1 of the first pad 20. The first pad 20 and the second pad 40 that are connected to each other may have a reverse T shape based on a shape of the first pad 20 and a shape of the second pad 40.

A first interface IF1 between the first pad 20 and the second pad 40 may be located at a level different from that of a second interface IF2 between the first dielectric layer 16 and the second dielectric layer 36. For example, the first interface IF1 may be disposed closer than the second interface IF2 to the first substrate 12.

As regards the first substrate 12, the top surface 20a of the first pad 20 may be located at a level lower than that of the top surface 16a of the first dielectric layer 16. In this sense, the first pad 20 may be provided on its top surface 20a with a first recess RS1 directed toward the first substrate 12. For example, as shown in FIG. 5, the top surface 20a of the first pad 20 and the top surface 16a of the first dielectric layer 16 may be parallel to each other. In this case, the top surface 20a of the first pad 20 may be closer to the first substrate 12 than the top surface 16a of the first dielectric layer 16. For example, the first recess RS1 may be provided due to a difference in level between the top surface 20a of the first pad 20 and the top surface 16a of the first dielectric layer 16. Alternatively, as shown in FIG. 6, the top surface 20a of the first pad 20 may be a concave surface that is recessed toward the first substrate 12. In this case, as regards the first substrate 12, an uppermost end of the top surface 20a of the first pad 20 may be located at a level the same as that of the top surface 16a of the first dielectric layer 16, and a lowermost end of the top surface 20a of the first pad 20 may be located at a level lower than that of the top surface 16a of the first dielectric layer 16. For example, the first recess RS1 may be provided due to recession of the top surface 20a of the first pad 20.

The second pad 40 may extend into the first recess RS1 to come into contact with the top surface 20a of the first pad 20. For example, as regards the first substrate 12, a bottom surface 40b of the second pad 40 may be located at a level lower than that of the bottom surface 36a of the second dielectric layer 36. In this sense, the second pad 40 may protrude toward the first substrate 12 from the bottom surface 36a of the second dielectric layer 36. A portion of the second pad 40 may be inserted into the first recess RS1. The portion of the second pad 40 may be in contact with the top surface 20a of the first pad 20.

According to some embodiments of the present inventive concepts, one of the first and second pads 20 and 40 may have a large area. Therefore, even when the upper structure 30 and the lower structure 10 are misaligned due to process error in fabricating the semiconductor device, the second pads 40 whose areas are small may completely and vertically overlap the first pads 20 whose areas are large, and constant contact areas may be provided between the first pads 20 and the second pads 40. For example, there may be uniform contact resistances may be provided between the first pads 20 and the second pads 40. Therefore, the semiconductor device may increase in bonding reliability and electrical properties.

The first pads 20 having large areas may be recessed on their top surfaces 20a in fabrication of the semiconductor device. According to some example embodiments of the present inventive concepts, as the second pads 40 extend into the first recesses RS1 formed on the top surfaces 20a of the first pads 20, even when the top surfaces 20a of the first pads 20 are recessed, an easy bonding may be achieved between the first pads 20 and the second pads 40. Thus, no contact failure may occur between the upper structure 30 and the lower structure 10. This will be discussed in detail when describing a method of fabricating a semiconductor device.

As shown in FIGS. 5 and 6, the second pad 40 may not completely fill the first recess RS1. For example, the first recess RS1 may have an empty space at a portion thereof. Therefore, on the first recess RS1, the second dielectric layer 36 may be spaced apart from the top surface 20a of the first pad 20. In addition, the second pad 40 may be spaced apart from the first dielectric layer 16. Alternatively, the portion of the first recess RS1 may be filled with the second dielectric layer 36. For example, a portion of the second dielectric layer 36 may extend into the first recess RS1. The portion of the second dielectric layer 36 may surround the second pad 40 in the first recess RS1. In the first recess RS1, the portion of the second dielectric layer 36 may be in contact with the top surface 20a of the first pad 20.

In the example embodiments that follow, a detailed description of technical features repetitive to those discussed above with reference to FIGS. 1 to 6 will be omitted, and a difference thereof will be discussed in detail. The same reference numerals may be allocated to the same components as those of the semiconductor device according to some example embodiments of the present inventive concepts.

Figure 7:
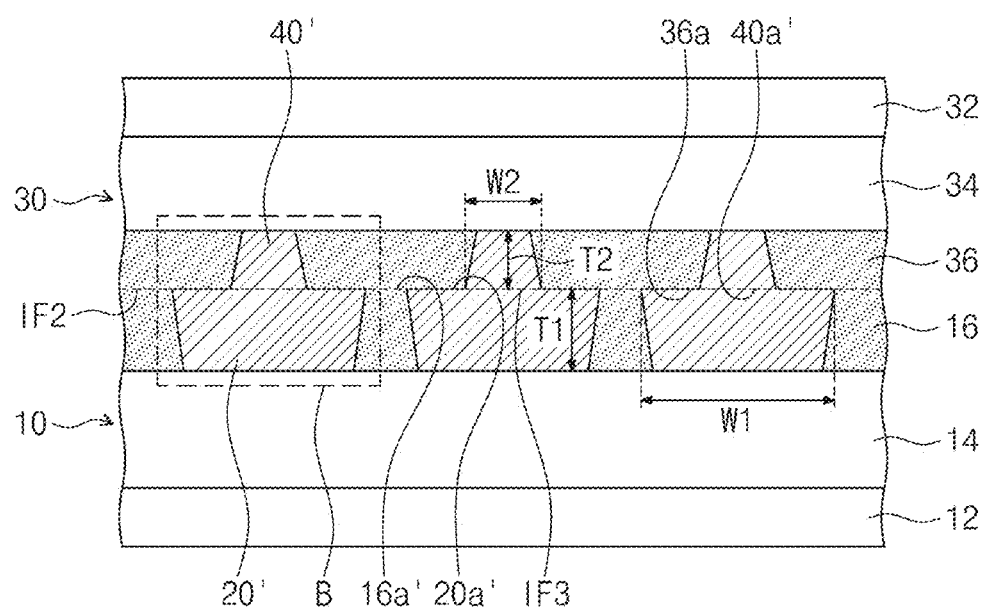
FIG. 7 illustrates a cross-sectional view showing a semiconductor device according to some example embodiments of the present inventive concepts.
Figure 8:
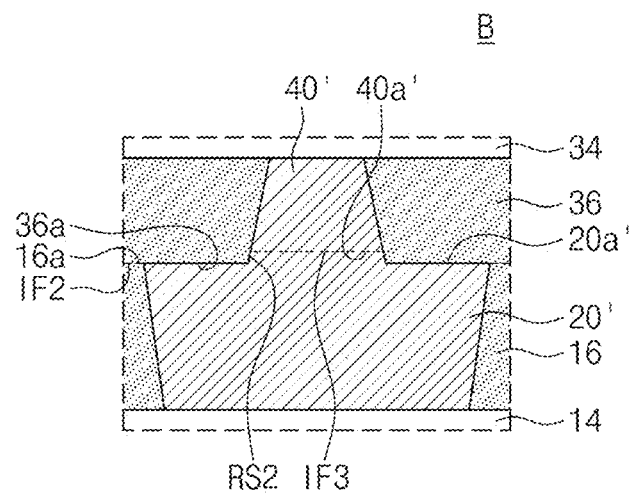
FIGS. 8 and 9 illustrate enlarged views showing section B of FIG. 7.
Figure 9:
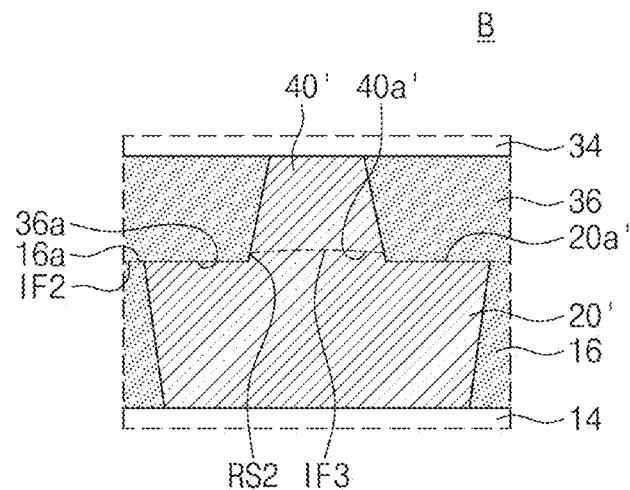

FIG. 7 illustrates a cross-sectional view showing a semiconductor device according to some example embodiments of the present inventive concepts. FIGS. 8 and 9 illustrate enlarged views showing section B of FIG. 7.

Referring to FIGS. 7 to 9, there may be disposed the lower structure 10 and the upper structure 30. The first pads 20 of the lower structure 10 may be vertically aligned with the second pads 40 of the upper structure 30. The lower structure 10 and the upper structure 30 may be brought into contact with each other to allow the first pads 20 and the second pads 40 to connect to each other.

The upper structure 30 may be connected to the lower structure 10. The lower structure 10 and the upper structure 30 may be brought into contact with each other. First pads 20' of the lower structure 10 and second pads 40' of the upper structure 30 may be bonded to each other at an interface between the lower structure 10 and the upper structure 30. In this case, the first pads 20' and the second pads 40' may constitute an intermetallic hybrid bonding.

A first width W1 of the first pad 20' may be greater than a second width W2 of the second pad 40'. A planar shape of the first pad 20' may be larger than that of the second pad 40'. A first area of the first pad 20' may be greater than a second area of the second pad 40', and when viewed in a plan view, the second pad 40' may be positioned within the first pad 20'. For example, when viewed in a plan view, an entirety of the second pad 40' may overlap at least a portion of the first pad 20'.

A first thickness T1 of the first pad 20' may be greater than a second thickness T2 of the second pad 40'. The first thickness T1 of the first pad 20' may be about 1.5 times to about 3 times the second thickness T2 of the second pad 40'.

A third interface IF3 between the first pad 20' and the second pad 40' may be located at a level different from that of the second interface IF2 between the first dielectric layer 16 and the second dielectric layer 36. For example, the third interface IF3 may be disposed closer than the second interface IF2 to the second substrate 32.

As regards the first substrate 12, a bottom surface 40a' of the second pad 40' may be located at a level higher than that of the bottom surface 36a of the second dielectric layer 36. For example, the second pad 40' may be provided on its bottom surface 40a' with a second recess RS2 directed toward the second substrate 32. As shown in FIG. 8, the bottom surface 40a' of the second pad 40' and the bottom surface 36a of the second dielectric layer 36 may be parallel to each other. The bottom surface 40a' of the second pad 40 may be closer to the second substrate 32 than the bottom surface 36a of the second dielectric layer 36. The second recess RS2 may be provided due to a difference in level between the bottom surface 40a' of the second pad 40 and the bottom surface 36a of the second dielectric layer 36. Alternatively, as shown in FIG. 9, the bottom surface 40a' of the second pad 40' may be a concave surface recessed toward the second substrate 32. The second recess RS2 may be located at a level higher than that of the top surface 16a of the first dielectric layer 16. For example, the second recess RS2 may be provided due to recession of the bottom surface 40a' of the second pad 40'.

The first pad 20' may extend into the second recess RS2 to come into contact with the bottom surface 40a' of the second pad 40'. For example, as regards the first substrate 12, the top surface 20a' of the first pad 20' may be located at a level higher than that of the top surface 16a of the first dielectric layer 16. Thus, the first pad 20' may protrude toward the second substrate 32 from the top surface 16a of the first dielectric layer 16. A portion of the first pad 20' may be inserted into the second recess RS2. The portion of the first pad 20' may be in contact with the bottom surface 40a' of the second pad 40'.

Figure 10:
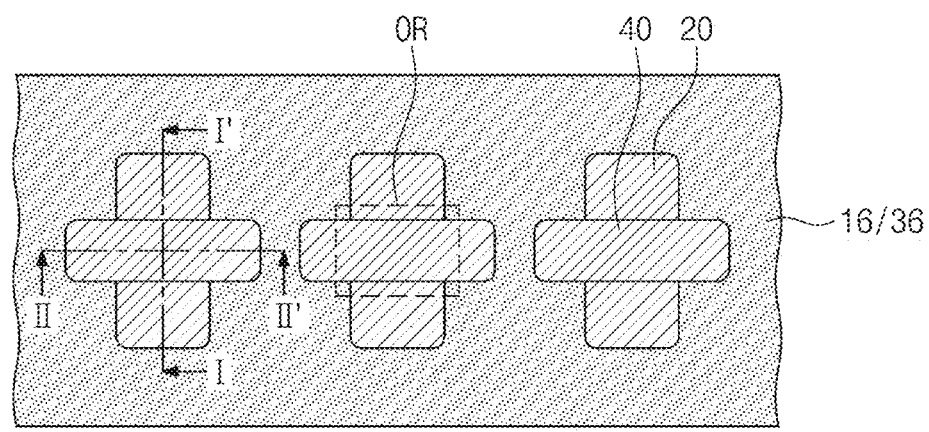
FIG. 10 illustrates a plan view showing a semiconductor device according to some example embodiments of the present inventive concepts.
Figure 11:
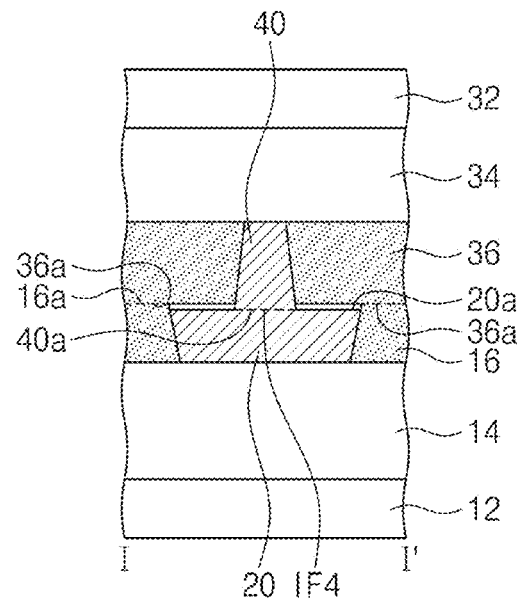
FIGS. 11 and 12 illustrate cross-sectional views showing a semiconductor device according to some example embodiments of the present inventive concepts.
Figure 12:
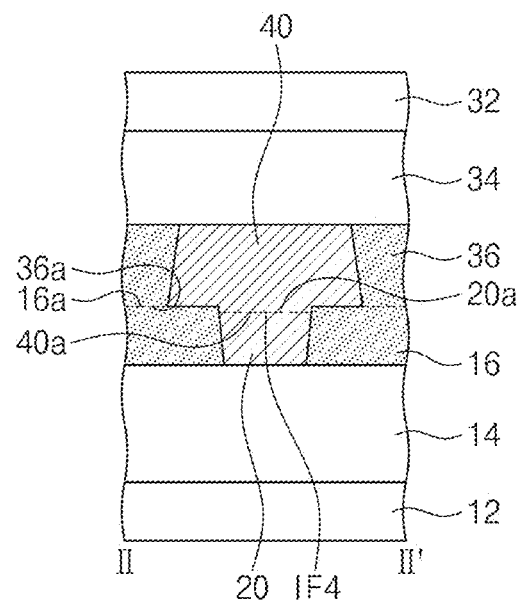

FIG. 10 illustrates a plan view showing a semiconductor device according to some example embodiments of the present inventive concepts. FIGS. 11 and 12 illustrate cross-sectional views showing a semiconductor device according to some example embodiments of the present inventive concepts.

Referring to FIGS. 10 to 12, there may be disposed the lower structure 10 and the upper structure 30. The first pads 20 of the lower structure 10 may be vertically aligned with the second pads 40 of the upper structure 30. The lower structure 10 and the upper structure 30 may be brought into contact with each other to allow the first pads 20 and the second pads 40 to connect to each other.

The upper structure 30 may be connected to the lower structure 10. The lower structure 10 and the upper structure 30 may be brought into contact with each other. The first pads 20 of the lower structure 10 and the second pads 40 of the upper structure 30 may be bonded to each other at an interface between the lower structure 10 and the upper structure 30. In this case, the first pads 20 and the second pads 40 may constitute an intermetallic hybrid bonding.

When viewed in a plan view, the first pad 20 may be shaped like a right-angled tetragon. For example, the first pad 20 may have a rectangular planar shape or a linear planar shape. In this case, the first pad 20 may have a first length in a major-axis direction and a first width in a minor-axis direction. According to an example embodiment, a ratio of the first length to the first width may be equal to or greater than about 2. For example, the ratio of the first length to the first width may range from about 2 to about 4, but the present example inventive concepts are not limited thereto.

The second pad 40 may have a structure the same as or similar to that of the first pad 20. The second pad 40 may be shaped like a right-angled tetragon. For example, the second pad 40 may have a rectangular planar shape or a linear planar shape. When viewed in a plan view, the second pad 40 may have a second length in a major-axis direction and a second width in a minor-axis direction. The second length and the second width may be substantially the same as the first length and the first width, respectively, but the present example inventive concepts are not limited thereto. Likewise, the case of the first pad 20, a ratio of the second length to the second width may be equal to or greater than about 2. For example, the ratio of the second length to the second width may range from about 2 to about 4, but the present example inventive concepts are not limited thereto.

The first pads 20 and the second pads 40 may be disposed to intersect each other. When viewed in a plan view, a pair of contacting first and second pads 20 and 40 may run across each other. For example, the first pads 20 and the second pads 40 may be disposed in a cross shape. The first pads 20 and the second pads 40 may be brought into contact with each other on regions (referred to hereinafter as overlapping regions OR) where the first pads 20 intersect or overlap the second pads 40.

According to some example embodiments of the present inventive concepts, as each of the first and second pads 20 and 40 has a rectangular planar shape whose ratio of major to minor axes is equal to or greater than about 2, a constant intersection area may be obtained while minimizing an effect of misalignment. For example, not only even when the first pads 20 and the second pads 40 are satisfactorily aligned with each other, but also even when the first pads 20 and the second pads 40 are slightly misaligned with each other, the overlapping region OR between the first pad 20 and the second pad 40 may have an area that corresponds to that obtained by multiplying the first width and the second width. As a result, on the overlapping regions OR between the first pads 20 and the second pads 40, it may be possible to obtain constant bonding areas between the first pads 20 and the second pads 40.

A planar shape of the first pad 20 may be larger than that of the second pad 40. A first area of the first pad 20 may be greater than a second area of the second pad 40. A second thickness of the second pad 40 may be greater than a first thickness of the first pad 20.

As regards the first substrate 12, the top surface 20a of the first pad 20 may be located at a level lower than that of the top surface 16a of the first dielectric layer 16. In this sense, the first pad 20 may be provided on its top surface 20a with the first recess RS1 directed toward the first substrate 12. For example, the first recess RS1 may be provided due to a difference in level between the top surface 20a of the first pad 20 and the top surface 16a of the first dielectric layer 16. Alternatively, the first recess RS1 may be provided due to recession of the top surface 20a of the first pad 20.

On the overlapping region OR, the second pad 40 may extend into the first recess RS1 to come into contact with the top surface 20a of the first pad 20. For example, as regards the first substrate 12, the bottom surface 40b of the second pad 40 may be located at a level lower than that of the bottom surface 36a of the second dielectric layer 36. In this sense, the second pad 40 may protrude toward the first substrate 12 from the bottom surface 36a of the second dielectric layer 36. A portion of the second pad 40 may be inserted into the first recess RS1. The portion of the second pad 40 may be in contact with the top surface 20a of the first pad 20. A fourth interface IF4 between the first pad 20 and the second pad 40 may be located at a level lower than that of an interface between the first dielectric layer 16 and the second dielectric layer 36.

Figure 13:
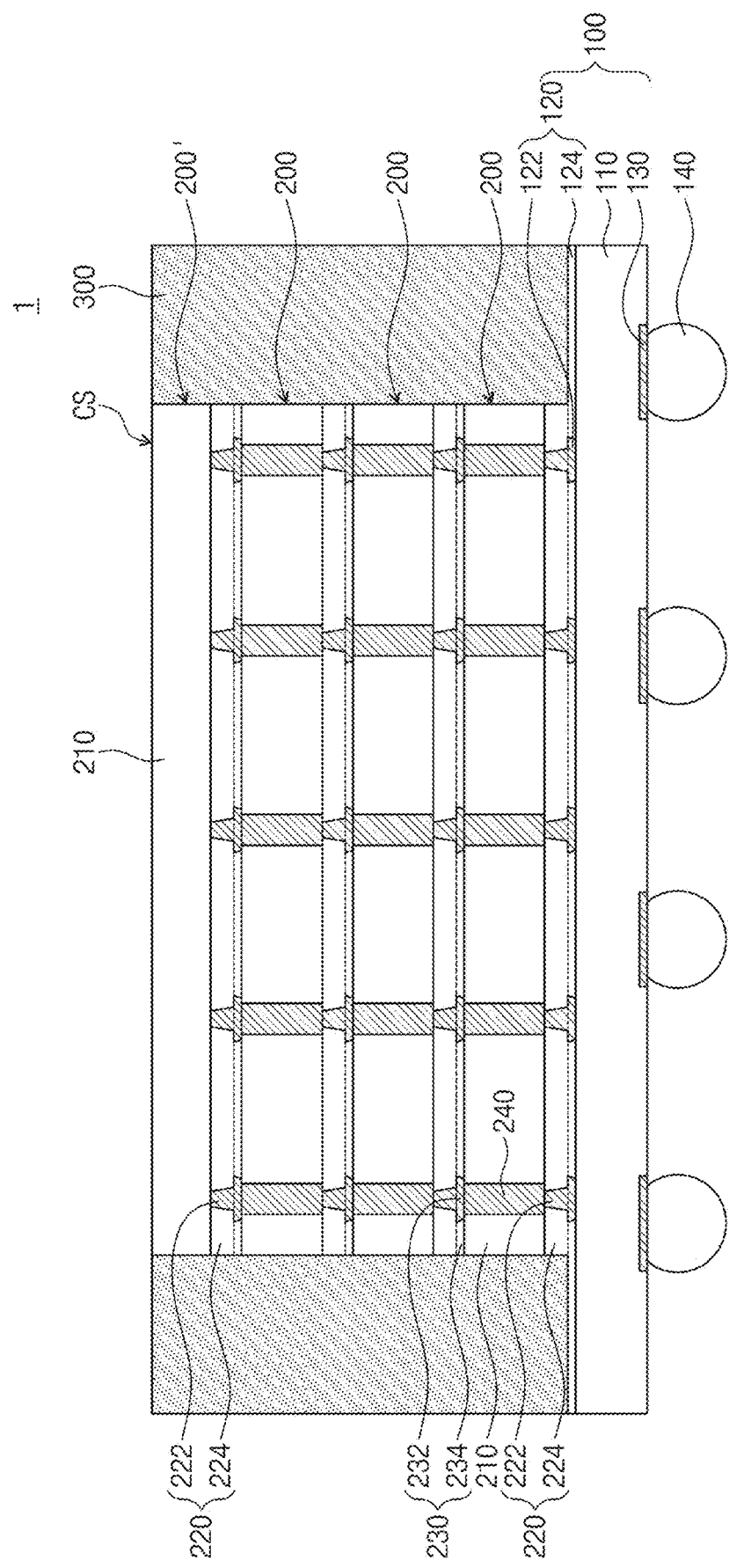
FIG. 13 illustrates a cross-sectional view showing a semiconductor device according to some example embodiments of the present inventive concepts.

FIG. 13 illustrates a cross-sectional view showing a semiconductor device according to some example embodiments of the present inventive concepts.

Referring to FIG. 13, a substrate 100 may be provided. The substrate 100 may be a package substrate such as a printed circuit board (PCB) or an interposer substrate provided in a package. Alternatively, the substrate 100 may be a semiconductor substrate on which semiconductor devices are formed or integrated. The substrate 100 may include a substrate base layer 110 and a substrate wiring layer 120 formed on the substrate base layer 110.

The substrate wiring layer 120 may include first substrate pads 122 exposed on a top surface of the substrate base layer 110, and may also include a substrate protective layer 124 that covers the substrate base layer 110 and surrounds the first substrate pads 122. In this case, top surfaces of the first substrate pads 122 may be coplanar with that of the substrate protective layer 124. Second substrate pads 130 may be provided which are exposed on a bottom surface of the substrate base layer 110. The substrate 100 may redistribute a chip stack CS which will be discussed below. For example, the first substrate pads 122 and the second substrate pads 130 may be electrically connected to each other through circuit lines in the substrate base layer 110, and a redistribution circuit may be constituted by the first substrate pads 122, the second substrate pads 130, and the circuit lines. The first substrate pads 122 and the second substrate pads 130 may include a conductive material, such as metal. For example, the first substrate pads 122 and the second substrate pads 130 may include copper (Cu). The substrate protective layer 124 may include a dielectric material, such as oxide, nitride, or oxynitride of a material included in the substrate base layer 110. For example, the substrate protective layer 124 may include silicon oxide (SiO), silicon nitride (SiN), or silicon oxynitride (SiON).

Substrate connection terminals 140 may be disposed on a bottom surface of the substrate 100. The substrate connection terminals 140 may be provided on the second substrate pads 130 of the substrate 100. The substrate connection terminals 140 may include solder balls or solder bumps. Based on type of the substrate connection terminals 140, a semiconductor device 1 may have a ball grid array (BGA) type, a fine ball-grid array (FBGA) type, or a land grid array (LGA) type.

A chip stack CS may be disposed on the substrate 100. The chip stack CS may include one or more semiconductor chips 200 and 200' stacked on the substrate 100. The semiconductor chips 200 and 200' may each be a memory chip, such as dynamic random access memory (DRAM), static random access memory (SRAM), magnetic random access memory (MRAM), or Flash memory. Alternatively, the semiconductor chips 200 and 200' may each be a logic chip. FIG. 13 shows that one chip stack CS is disposed, but the present inventive concepts are not limited thereto. When the chip stack CS is provided in plural, the plurality of chip stacks CS may be spaced apart from each other on the substrate 100.

One semiconductor chip 200 may be mounted on the substrate 100. The semiconductor chip 200 may include a semiconductor material, such as silicon (Si).

The semiconductor chip 200 may include a chip base layer 210, a first chip wiring layer 220 disposed on a front surface of the semiconductor chip 200, and a second chip wiring layer 230 on a rear surface of the semiconductor chip 200. In this description, the language "front surface" may be defined to indicate a surface on an active surface of an integrated element in a semiconductor chip or a surface on which are formed a plurality of pads of a semiconductor chip, and the language "rear surface" may be defined to indicate an opposite surface opposite to the front surface.

The first chip wiring layer 220 may include first chip pads 222 on the chip base layer 210, and may also include a first chip protective layer 224 that surrounds the first chip pads 222 on the chip base layer 210. The first chip pads 222 may be electrically connected to an integrated element or integrated circuits in the semiconductor chip 200. According to some embodiments, redistribution lines may be provided between the first chip pads 222 and an integrate element in the semiconductor chip 200. The first chip pads 222 may include a conductive material, such as metal. For example, the first chip pads 222 may include copper (Cu). The first chip protective layer 224 may include a dielectric material. For example, the first chip protective layer 224 may include silicon oxide (SiO), silicon nitride (SiN), or silicon oxynitride (SiON).

The second chip wiring layer 230 may include second chip pads 232 on the chip base layer 210, and may also include a second chip protective layer 234 that surrounds the second chip pads 232 on the chip base layer 210. The second chip pads 232 may be electrically connected to the first chip wiring layer 220. According to some embodiments, the second chip pads 232 may be coupled to the first chip wiring layer 220 via through electrodes 240 that vertically penetrate the chip base layer 210. The second chip pads 232 may include a conductive material, such as metal. For example, the second chip pads 232 may include copper (Cu). The second chip protective layer 234 may include a dielectric material. For example, the second chip protective layer 234 may include silicon oxide (SiO), silicon nitride (SiN), or silicon oxynitride (SiON).

The semiconductor chip 200 may be mounted on the substrate 100. As shown in FIG. 13, the semiconductor chip 200 may be disposed to allow its front surface to face toward the substrate 100, and may be electrically connected to the substrate 100. The front surface of the semiconductor chip 200, or a bottom surface of the first chip wiring layer 220 may be in contact with a top surface of the substrate 100. For example, the first chip pads 222 of the semiconductor chip 200 may be in contact with the first substrate pads 122 of the substrate 100, and the first chip protective layer 224 may be in contact with the substrate protective layer 124 of the substrate 100.

The semiconductor chip 200 may be provided in plural. For example, another semiconductor chip 200 may be mounted to one semiconductor chip 200. The another semiconductor chip 200 may be disposed to allow its front surface to face toward the one semiconductor chip 200. The front surface of the another semiconductor chip 200 may be in contact with the rear surface of the semiconductor chip 200. For example, the first chip wiring layer 220 of the another semiconductor chip 200 may be in contact with the second chip wiring layer 230 of the one semiconductor chip 200. For more detail, the semiconductor chips 200 may be stacked on each other to allow the first and second chip protective layers 224 and 234 to come into contact with each other and to allow the first and second chip pads 222 and 232 to come into contact with each other.

The second chip pads 232 may correspond to the first pads 20 discussed with reference to FIGS. 1 to 6, and the first chip pads 222 may correspond to the second pads 40 discussed with reference to FIGS. 1 to 6. For example, the second chip pad 232 may have a width greater than that of the first chip pad 222, and the first chip pad 222 may have a thickness greater than that of the second chip pad 232. Although not shown in FIG. 13, a top surface of the second chip pad 232 may have a recess region that is recessed from a top surface of the second chip protective layer 234, and the first chip pad 222 may extend into the recess region to come into contact with the second chip pad 232. Therefore, boundaries between the first chip pads 222 and the second chip pads 232 may be located at a level different from that of a boundary between the first chip protective layer 224 and the second chip protective layer 234. The first chip pads 222 and the second chip pads 232 may constitute an intermetallic hybrid bonding. For example, the first chip pad 222 and the second chip pad 232 may be provided in the form of one component. The semiconductor chips 200 may be electrically connected to each other through the first chip pads 222 and the second chip pads 232. As such, a plurality of semiconductor chips 200 and 200' may be stacked on the substrate 100.

An uppermost semiconductor chip 200' among the semiconductor chips 200 and 200' of the chip stack CS may have a configuration slightly different from those of other semiconductor chips 200. For example, the uppermost semiconductor chip 200' may have neither the second chip wiring layer 230 nor the through electrodes 240.

A molding layer 300 may be provided on the substrate 100. The molding layer 300 may cover the top surface of the substrate 100. The molding layer 300 may encapsulate the chip stack CS. For example, the molding layer 300 may cover lateral surfaces of the semiconductor chips 200. The molding layer 300 may protect the chip stack CS. The molding layer 300 may include a dielectric material. For example, the molding layer 300 may include an epoxy molding compound (EMC). Differently from that shown, the molding layer 300 may be formed to cover the chip stack CS. Thus, the molding layer 300 may cover a rear surface of the uppermost semiconductor chip 200'.

It is illustrated that the semiconductor chips 200 are mounted on the substrate 100, but the present inventive concepts are not limited thereto. According to some embodiments, the semiconductor chips 200 may be mounted on a base semiconductor chip. The base semiconductor chip may be a wafer-level semiconductor substrate formed of silicon. The base semiconductor chip may include an integrated circuit. For example, the integrated circuit may include a memory circuit, a logic circuit, or a combination thereof.

Figure 14:
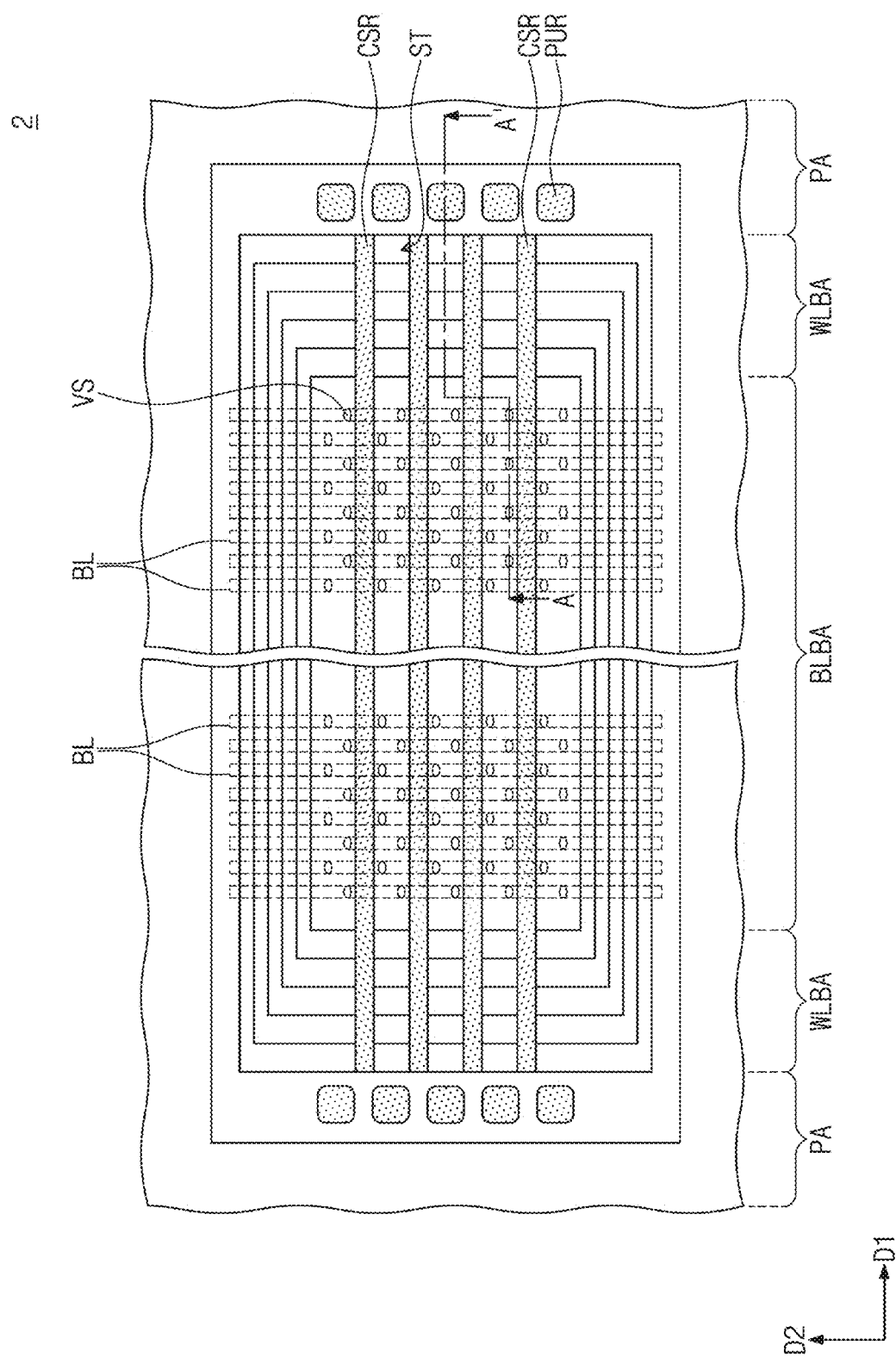
FIG. 14 illustrates a plan view showing a semiconductor device according to some example embodiments of the present inventive concepts.
Figure 15:
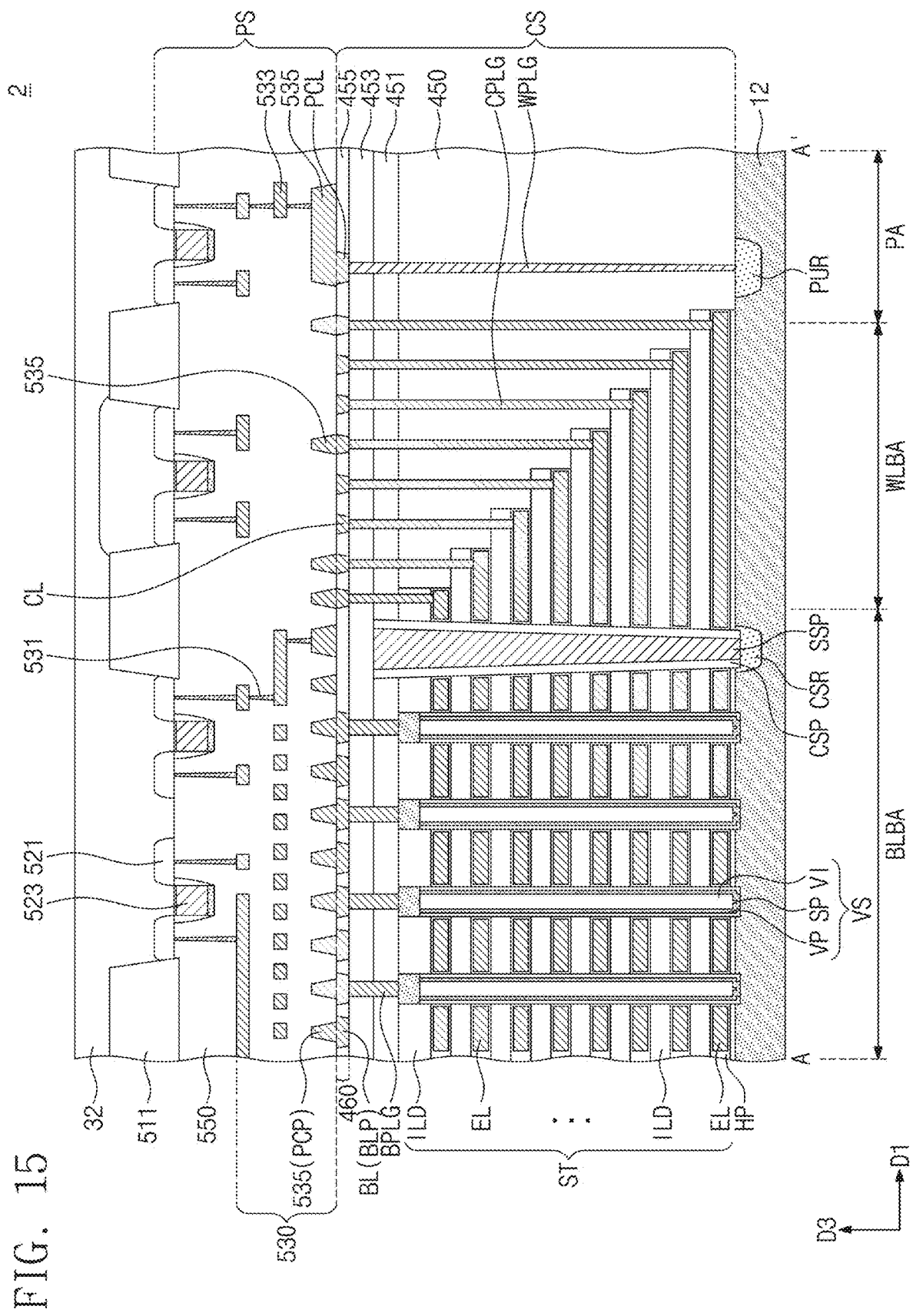
FIG. 15 illustrates a cross-sectional view showing a semiconductor device according to some example embodiments of the present inventive concepts.

FIG. 14 illustrates a plan view showing a semiconductor device according to some example embodiments of the present inventive concepts. FIG. 15 illustrates a cross-sectional view taken along line A-A' of FIG. 14, showing a semiconductor device according to some example embodiments of the present inventive concepts.

Referring to FIGS. 14 and 15, a semiconductor device 2 may be a memory device. The semiconductor device 2 may have a chip-to-chip structure. The chip-to-chip structure may be fabricated by forming on a first wafer an upper chip including a cell array structure CS; forming, on a second wafer different from the first wafer, a lower chip including a peripheral circuit structure PS; and then using a bonding method to connect the upper chip and the lower chip to each other. For example, the bonding method may include electrically connecting a bonding metal formed on an uppermost metal layer of the upper chip to a bonding metal formed on an uppermost metal layer of the lower chip. For example, when the bonding metal is formed of copper (Cu), the bonding method may be a Cu—Cu bonding method, and the bonding metal may also be formed of aluminum or tungsten.

Each of the cell array structure CS and the peripheral circuit structure PS of the semiconductor device 2 may include an external pad bonding area PA, a word-line bonding area WLBA, and a bit-line bonding area BLBA.

A first substrate 12 may be provided. The first substrate 12 may be formed of a semiconductor material, for example, a silicon (Si) substrate, a silicon-germanium (SiGe) substrate, a germanium (Ge) substrate, or a single-crystalline epitaxial layer grown on a single-crystalline silicon substrate. For example, the first substrate 12 may be a silicon substrate. In addition, the first substrate 12 may include a semiconductor doped with impurities having a first conductivity type (e.g., p-type) and/or an intrinsic semiconductor doped with no impurity.

According to some embodiments, the cell array structure CS may be provided on the first substrate 12, and may include stack structures ST, vertical structures VS, and connection line structures CPLG, CL, WPLG, and PCL. For example, the first substrate 12 and the cell array structure CS may correspond to the lower structure 10 discussed with reference to FIG. 1, and a portion of the cell array structure CS may correspond to the first circuit layer 14 discussed with reference to FIG. 1.

On the first substrate 12, the stack structures ST may extend lengthwise in parallel in a first direction D1 and may be arranged spaced apart from each other in a second direction D2. Each of the stack structures ST may include electrodes EL vertically stacked on the first substrate 12 and dielectric layers ILD interposed between the electrodes EL. The dielectric layers ILD of the stack structures ST may have their thicknesses that can be changed depending on characteristics of a semiconductor memory device. For example, one or more of the dielectric layers ILD may be formed thicker than other ones of the dielectric layers ILD. The dielectric layers ILD may include silicon oxide (SiO). The electrodes EL may include a conductive material including, for example, at least one selected from a semiconductor layer, a metal silicon layer, a metal layer, a metal nitride layer, and a combination thereof.

The stack structures ST may extend along the first direction D1 from the bit-line bonding area BLBA toward the word-line bonding area WLBA, and may have their stepped structures on the word-line bonding area WLBA. The electrodes EL of the stack structures ST may have their lengths in the first direction D1 that decrease with increasing distance from the first substrate 12. The stack structures ST may have variously shaped stepwise structures on the word-line bonding area WLBA.

In some embodiments, the semiconductor device 2 may be a three-dimensional NAND Flash memory device, and cell strings may be integrated on the first substrate 12. In this case, the stack structures ST may be configured such that uppermost and lowermost electrodes EL may be used as gate electrodes of selection transistors. For example, the uppermost electrode EL may serve as a gate electrode of a string selection transistor that controls an electrical connection between a bit line BL and the vertical structures VS, and the lowermost electrode EL may serve as a gate electrode of a ground selection transistor that controls an electrical connection between a common source line and the vertical structures VS. Other electrodes EL between the uppermost and lowermost electrodes EL may serve as control gate electrodes of memory cells and as word lines that connect the control gate electrodes to each other.

On the bit-line bonding area BLBA, the vertical structures VS may penetrate the stack structures ST to come into contact with the first substrate 12. The vertical structures VS may be electrically connected to the first substrate 12. When viewed in a plan view, the vertical structures VS may be arranged in a straight or zigzag fashion along one direction. In addition, on the word-line bonding area WLBA or the external pad bonding area PA, dummy vertical structures (not shown) may be provided which have substantially the same structure as that of the vertical structures VS.

The vertical structures VS may include a semiconductor material, such as silicon (Si), germanium (Ge), or a mixture thereof. Additionally or alternatively, the vertical structures VS may include an impurity-doped semiconductor or an undoped intrinsic semiconductor. The vertical structures VS including a semiconductor material may be used as channels of selection transistors and memory cell transistors. The vertical structures VS may have their bottom surfaces between top and bottom surfaces of the first substrate 12. The vertical structures VS may each be provided on its upper end with a contact pad coupled to a bit-line contact plug BPLG.

Each of the vertical structures VS may include a vertical dielectric pattern VP and a semiconductor pattern SP in contact with the first substrate 12. The semiconductor pattern SP may have a hollow pipe shape or a macaroni shape. The semiconductor pattern SP may have a closed shape at a bottom end thereof, and a buried dielectric pattern VI may fill an inside of the semiconductor pattern SP. The semiconductor pattern SP may be in contact with a top surface of the first substrate 12. The semiconductor pattern SP may be undoped or doped with impurities whose conductivity type is the same as that of the first substrate 12. The semiconductor pattern SP may be polycrystalline or single-crystalline.

The vertical dielectric pattern VP may be disposed between the stack structure ST and the vertical structure VS. The vertical dielectric pattern VP may extend in a third direction D3 and may surround a sidewall of the vertical structure VS. For example, the vertical dielectric pattern VP may have a macaroni shape or a pipe shape whose top and bottom ends are opened. The vertical dielectric pattern VP may be formed of a single thin layer or a plurality of thin layers. In some embodiments of the present inventive concepts, the vertical dielectric pattern VP may be a portion of a data storage layer. For example, the vertical dielectric pattern VP may include a tunnel dielectric layer, a charge storage layer, and a blocking dielectric layer, which layers constitute a data storage layer of a NAND Flash memory device. For example, the charge storage layer may be a trap dielectric layer, a floating gate electrode, or a dielectric layer including conductive nano-dots. In more detail, the charge storage layer may include at least one selected from silicon nitride (SiN), silicon oxynitride (SiON), silicon-rich nitride, nano-crystalline silicon, and a laminated trap layer. The tunnel dielectric layer may be one of materials whose band gap is greater than that of the charge storage layer, and the blocking dielectric layer may be a high-k dielectric layer such as aluminum oxide ($Al_2O_3$) and hafnium oxide ($Hf_2O$). Alternatively, the vertical dielectric pattern VP may include a thin layer either for a phase change memory device or for a variable resistance memory device.

A horizontal dielectric pattern HP may be provided between the vertical dielectric pattern VP and sidewalls of the electrodes EL. The horizontal dielectric pattern HP may extend onto top and bottom surfaces of the electrodes EL from the sidewalls of the electrodes EL. The horizontal dielectric pattern HP may include a charge storage layer and a tunnel dielectric layer that serve as a component of a data storage layer of a NAND Flash memory device. Alternatively, the horizontal dielectric pattern HP may include a blocking dielectric layer.

Common source regions CSR may be provided in the first substrate 12 between neighboring stack structures ST. The common source regions CSR may extend lengthwise in the first direction D1 parallel to the stack structures ST. The common source regions CSR may be formed by doping the first substrate 12 with impurities having a second conductivity type. The common source regions CSR may include, for example, N-type impurities (e.g., arsenic (As) or phosphorous (P)).

A common source plug CSP may be coupled to the common source region CSR. A side dielectric spacer SSP may be interposed between the common source plug CSP and the stack structures ST. In a read or program mode of a three-dimensional NAND Flash memory device, a ground voltage may be applied through the common source plug CSP to the common source region CSR.

A first buried dielectric layer 450 may be disposed on the first substrate 12, covering stepwise ends of the electrodes EL. A first interlayer dielectric layer 451 may cover top surfaces of the vertical structures VS, and may be provided thereon with a second interlayer dielectric layer 453 that covers a top surface of the common source plug CSP.

Bit lines BL may be provided on the second interlayer dielectric layer 453, and may extend lengthwise in the second direction D2 to thereby cross over the stack structures ST. Each of the bit lines BL may be electrically connected through the bit-line contact plug BPLG to the vertical structure VS. The bit lines BL may correspond to pads for electrical connection with the peripheral circuit structure PS which will be discussed. The bit lines BL may have bit-line pads BLP. The bit-line pads BLP may be the same as or similar to the first pads 20 discussed with reference to FIG. 1.

The stepwise ends of the stack structures ST may be provided thereon with a connection line structure that electrically connects the cell array structure CS to the peripheral circuit structure PS. The connection line structure may include cell contact plugs CPLG that penetrate the first buried dielectric layer 450 and the first and second interlayer dielectric layers 451 and 453 to come into connection with corresponding ends of the electrodes EL, and may also include connection lines CL that are provided on the second interlayer dielectric layer 453 to come into connection with corresponding cell contact plugs CPLG. In addition, the connection line structure may include well contact plugs WPLG coupled to well pick-up regions PUR in the first substrate 12, and may also include peripheral connection lines PCL connected to the well contact plugs WPLG. The bit lines BL, the connection lines CL, and the peripheral connection lines PCL may constitute a cell array wiring layer 460.

The first substrate 12 may have therein the well pick-up regions PUR that are disposed adjacent to opposite ends of each of the stack structures ST. The well pick-up regions PUR may have the same conductivity type as that of the first substrate 12 and an impurity concentration greater than that of the first substrate 12. For example, the well pick-up regions PUR may include heavily doped p-type impurities (e.g., boron (B)). According to some embodiments, in an erase operation of a three-dimensional NAND Flash memory device, an erase voltage may be applied to the well pick-up regions PUR through the connection contact plugs PPLG and the well contact plugs WPLG.

The second interlayer dielectric layer 453 may be provided thereon with a third interlayer dielectric layer 455 that surrounds the bit lines BL, the connection lines CL, and the peripheral connection lines PCL. The third interlayer dielectric layer 455 may expose top surface of the bit-line pads BLP, top surfaces of the connection lines CL, and top surfaces of the peripheral connection lines PCL. The third interlayer dielectric layer 455 may be the same as or similar to the first dielectric layer 16 discussed with reference to FIG. 1. The bit lines BL, the connection lines CL, and the peripheral connection lines PCL may constitute a cell array wiring layer 460. The bit lines BL, the connection lines CL, and the peripheral connection lines PCL may correspond to pads of the cell array structure CS electrically connected to the peripheral circuit structure PS which will be discussed below.

As such, the cell array structure CS may be disposed on the first substrate 12.

The peripheral circuit structure PS may be disposed on the cell array structure CS.

A second substrate 32 may be provided. The second substrate 32 may be a silicon substrate, a silicon-germanium substrate, a germanium substrate, or a single-crystalline epitaxial layer grown on a single-crystalline silicon substrate. For example, the second substrate 32 may be a silicon substrate having a first conductivity type (e.g., p-type), and may include well regions.

The peripheral logic structure PS may include peripheral circuits integrated on a front surface of the second substrate 32 and a second buried dielectric layer 550 that covers the peripheral circuits. For example, the second substrate 32 and the peripheral circuit structure PS may correspond to the upper structure 30 discussed with reference to FIG. 1, and a portion of the peripheral circuit structure PS may correspond to the second circuit layer 34 discussed with reference to FIG. 1.

The peripheral circuits may be row and column decoders, page buffers, and a control circuit, and may include NMOS and PMOS transistors, low-voltage and high-voltage transistors, and a resistor that are integrated on one surface of the second substrate 32. For example, the peripheral circuits may include a free charge control circuit that controls a plurality of data program steps for a plurality of memory cells and that controls one or more of a plurality of cell strings.

For example, the second substrate 32 may be provided therein with a device isolation layer 511 that defines active regions. Peripheral gate electrodes 523 may be disposed on the active regions of the second substrate 32, and gate dielectric layers may be interposed between the peripheral gate electrodes 523 and the second substrate 32. Source/drain regions 521 may be provided in the second substrate 32 on opposite sides of each of the peripheral gate electrodes 523.

A peripheral circuit wiring layer 530 may be connected to the peripheral circuits on the second substrate 32. The peripheral circuit wiring layer 530 may include peripheral circuit lines 533 and peripheral circuit contact plugs 531. The peripheral circuit lines 533 may be electrically connected through the peripheral circuit contact plugs 531 to the peripheral circuits. For example, the peripheral circuit contact plugs 531 and the peripheral circuit lines 533 may be coupled to the NMOS and PMOS transistors.

The second buried dielectric layer 550 may cover the peripheral gate electrodes 523, the peripheral circuit contact plugs 531, and the peripheral circuit lines 533. The peripheral circuit wiring layer 530 may further include exposure lines 535 that are exposed on a bottom surface of the second buried dielectric layer 550. The exposure lines 535 may correspond to pads for electrical connection of the peripheral circuit structure PS to the cell array structure CS. The exposure lines 535 may have peripheral circuit pads PCP. The peripheral circuit pads PCP may be the same as or similar to the second pads 40 discussed with reference to FIG. 1. For example, the peripheral circuit pad PCP may have a width less than that of the bit-line pad BLP, and may have a thickness greater than that of the bit-line pad BLP.

The second buried dielectric layer 550 may include a plurality of stacked dielectric layers. For example, the second buried dielectric layer 550 may include one or more of silicon oxide (SiO), silicon nitride (SiN), silicon oxynitride (SiON), and low-k dielectric materials. In an embodiment, the peripheral circuit lines 533 and the peripheral circuit contact plugs 531 may be formed of tungsten whose resistance is relatively higher, and the exposure lines 535 may be formed of copper whose resistance is relatively lower.

In this description, the peripheral circuit lines 533 are illustrated to reside at a single level, but the present example inventive concepts are not limited thereto, and the peripheral circuit lines 533 may be stacked at different levels. In this case, one or more of the peripheral circuit lines 533 may be formed of aluminum whose resistance is less than that of copper of which the exposure lines 535 are formed.

The cell array structure CS and the peripheral circuit structure PS may be in direct contact with each other. For example, as shown in FIG. 15, the cell array wiring layer 460 of the cell array structure CS may be in contact with the peripheral circuit wiring layer 530 of the peripheral circuit structure PS. For example, the third interlayer dielectric layer 455 may be in contact with the second buried dielectric layer 550, and the exposure lines 535 may be connected to the bit lines BL, the connection lines CL, and one or more of the peripheral connection lines PCL. In this case, the cell array wiring layer 460 and the peripheral circuit wiring layer 530 may constitute an intermetallic hybrid bonding. The bit-line pad BLP and the exposure line 535 may have a continuous configuration, and an invisible interface may be provided between the bit-line pad BLP and the exposure line 535. For example, the bit-line pad BLP and the exposure line 535 may be formed of the same material, and thus no interface may be present between the bit-line pad BLP and the exposure line 535. In such a configuration, the bit-line pad BLP and its corresponding exposure line 535 may be provided in the form of one component. Although not shown in FIG. 15, a top surface of the bit-line pad BLP may have a recess region that is recessed from a top surface of the third interlayer dielectric layer 455, and the exposure line 535 may extend into the recess region to come into contact with the bit-line pad BLP. Therefore, boundaries between the bit-line pads BLP and the exposure lines 535 may be located at a level different from that of a boundary between the third interlayer dielectric layer 455 and the second buried dielectric layer 550.

FIGS. 16 to 21 illustrate cross-sectional views showing a method of fabricating a semiconductor device according to some example embodiments of the present inventive concepts.

Figure 16:
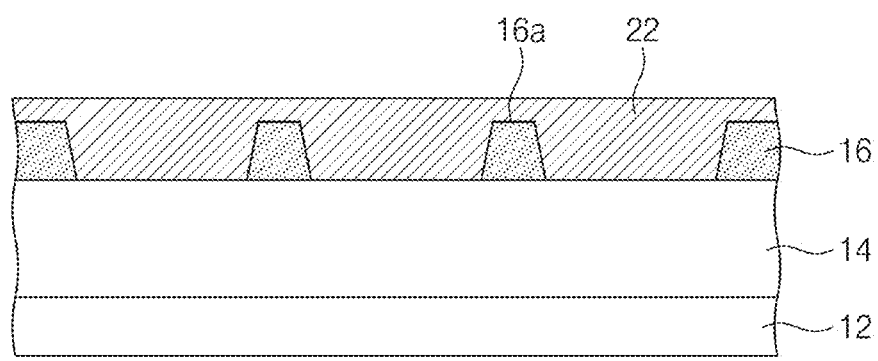
FIGS. 16 to 21 illustrate cross-sectional views showing a method of fabricating a semiconductor device according to some example embodiments of the present inventive concepts.

Referring to FIG. 16, a first substrate 12 may be provided. The first substrate 12 may be a semiconductor substrate. A first circuit layer 14 may be formed on the first substrate 12. A dielectric material may be deposited on the first circuit layer 14 to form a first dielectric layer 16. The first dielectric layer 16 may be patterned to form holes in which first pads (see 20 of FIG. 17) will be provided. A first conductive layer 22 filling the holes may be formed on the first dielectric layer 16. The formation of the first conductive layer 22 may include performing a plating process that uses a seed layer. The first conductive layer 22 may cover a top surface 16a of the first dielectric layer 16.

Figure 17:
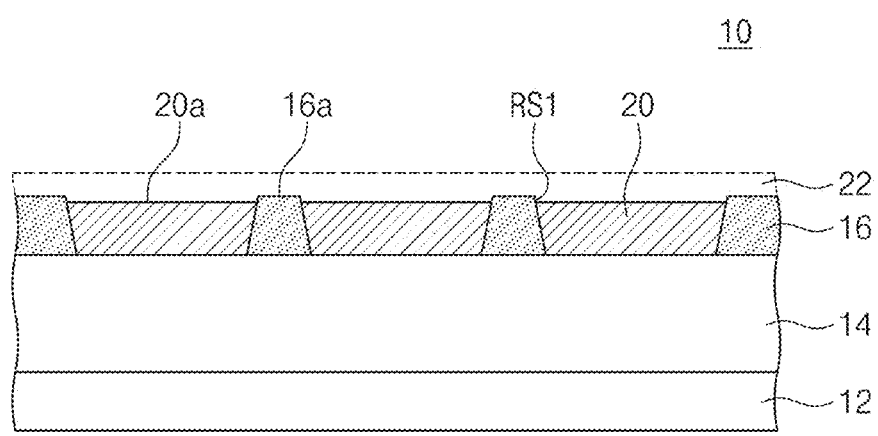

Referring to FIG. 17, a first planarization process may be performed on the first conductive layer 22. The first planarization process may be carried out such that an upper portion of the first conductive layer 22 may be removed to form first pads 20. The top surface 16a of the first dielectric layer 16 may be exposed.

During the first planarization process, the first conductive layer 22 may be over-etched. Therefore, top surfaces 20a of the first pads 20 may be located at a level lower than that of the top surface 16a of the first dielectric layer 16. For example, the top surfaces 20a of the first pads 20 may be closer to the first substrate 12 than the top surface 16a of the first dielectric layer 16. A first recess RS1 may be formed due to a difference in level between the top surfaces 20a of the first pads 20 and the top surface 16a of the first dielectric layer 16. As such, a lower structure 10 may be formed.

Figure 18:
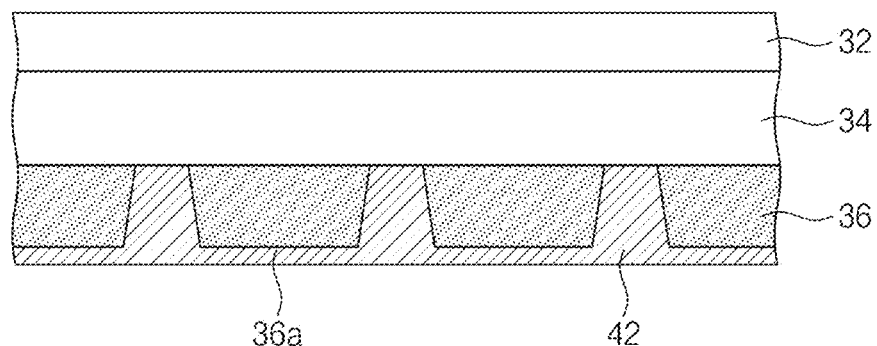

Referring to FIG. 18, a second substrate 32 may be provided. The second substrate 32 may be a semiconductor substrate. A second circuit layer 34 may be formed on the second substrate 32. A dielectric material may be deposited on the second circuit layer 34 to form a second dielectric layer 36. The second dielectric layer 36 may be patterned to form holes in which second pads (see 40 of FIG. 19) will be provided. A second conductive layer 42 filling the holes may be formed on the second dielectric layer 36. The formation of the second conductive layer 42 may include performing a plating process that uses a seed layer. The second conductive layer 42 may cover a bottom surface 36a of the second dielectric layer 36.

Figure 19:
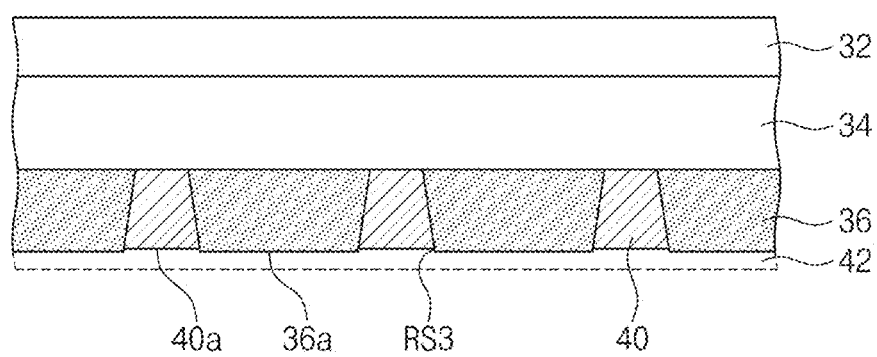

Referring to FIG. 19, a second planarization process may be performed on the second conductive layer 42. The second planarization process may be carried out such that an upper portion of the second conductive layer 42 may be removed to form second pads 40. The bottom surface 36a of the second dielectric layer 36 may be exposed.

During the first planarization process, the second conductive layer 42 may be over-etched. Therefore, bottom surfaces 40a of the second pads 40 may be located at a level higher than that of the bottom surface 36a of the second dielectric layer 36. For example, the bottom surfaces 40a of the second pads 40 may be closer to the second substrate 32 than the bottom surface 36a of the second dielectric layer 36. A third recess RS3 may be formed due to a difference in level between the bottom surfaces 40a of the second pads 40 and the bottom surface 36a of the second dielectric layer 36. As such, an upper structure 30 may be formed.

Referring to FIGS. 17 and 19, in comparison with the lower structure 10 and the upper structure 30, an area of the first pad 20 may be greater than that of the second pad 40. Therefore, an over-etch depth of the first pads 20 during the first planarization process may be greater than that of the second pads 40 during the second planarization process. For example, a depth of the first recess RS1 may be greater than that of the third recess RS3.

Figure 20:
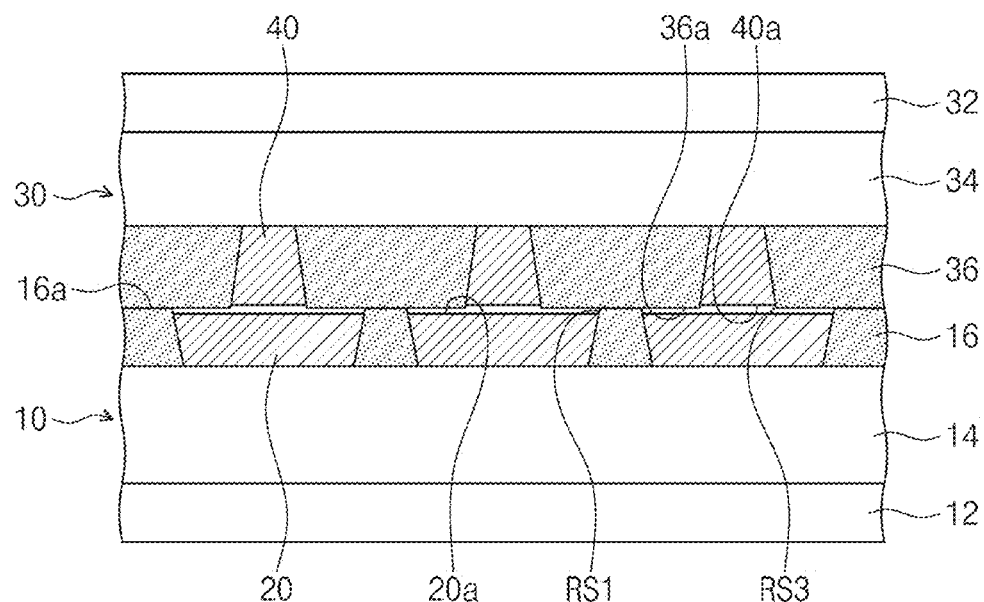

Referring to FIG. 20, the upper structure 30 may be provided on the lower structure 10. For example, the upper structure 30 may be positioned on the lower structure 10 to cause the first pads 20 and the second pads 40 to vertically align with each other.

Afterwards, the lower structure 10 and the upper structure 30 may be brought into contact with each other. The top surface 16a of the first dielectric layer 16 may be in contact with the bottom surface 36a of the second dielectric layer 36. In this step, the first recess RS1 may separate the first pads 20 from the bottom surface 36a of the second dielectric layer 36. The first recess RS1 and the third recess RS3 may separate the bottom surfaces 40a of the second pads 40 from the top surfaces 20a of the first pads 20.

Figure 21:
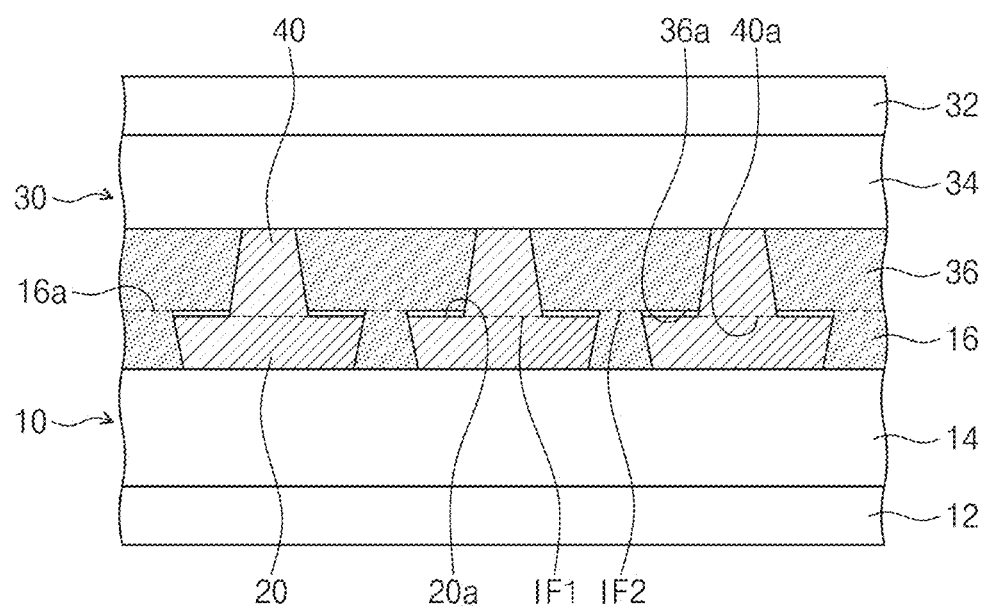

Referring to FIG. 21, an annealing process may be performed on the lower structure 10 and the upper structure 30. The annealing process may expand the first pads 20 and the second pads 40. The following will describe in detail the expansion of the first pads 20 and the second pads 40.

The first pads 20 may expand toward the upper structure 30. The first pad 20 may have an increased thickness. As the first recess RS1 is formed deeper in the first planarization process, the top surfaces 20a of the first pads 20 may not be higher than the top surface 16a of the first dielectric layer 16. For example, during the annealing process, the first recess RS1 may only become smaller, and may not disappear. Even after the annealing process, the first pads 20 may still be spaced apart from the bottom surface 36a of the second dielectric layer 36.

The second pads 40 may expand toward the lower structure 10. The second pad 40 may have an increased thickness. For example, in comparison with the lower structure 10 and the upper structure 30, the second pad 40 may have a thickness greater than that of the first pad 20. Therefore, a vertical expansion distance of the second pad 40 may be greater than that of the first pad 20. In addition, as the third recess RS3 is formed shallower in the second planarization process, the bottom surfaces 40a of the second pads 40 may be lower than the bottom surface 36a of the second dielectric layer 36. For example, the third recess RS3 may disappear during the annealing process, and the second pads 40 may protrude toward the first substrate 12 from the bottom surface 36a of the second dielectric layer 36.

The second pads 40 may extend into the first recess RS1 to come into contact with the top surfaces 20a of the first pads 20. The first pads 20 may be bonded to the second pads 40. For example, the first and second pads 20 and 40 may be bonded to constitute a single unitary body. The bonding of the first and second pads 20 and 40 may be naturally achieved. For example, the first pads 20 and the second pads 40 may include the same material (e.g., copper), and may be bonded to each other by an intermetallic hybrid bonding process (e.g., Cu—Cu hybrid bonding) due to a surface activation at a first interface IF1 between the first pads 20 and the second pads 40 that are in contact with each other. The first interface IF1 between the first pads 20 and the second pads 40 may be closer to the first substrate 12 than a second interface IF2 between the first dielectric layer 16 and the second dielectric layer 36.

According to some example embodiments of the present inventive concepts, the first pad 20 may have an area greater than that of the second pad 40. Therefore, even the lower structure 10 and the upper structure 30 are misaligned due to process error when the lower structure 10 and the upper structure 30 are bonded to each other, a constant contact area may be provided between the first pads 20 and the second pads 40.

Moreover, as the first pads 20 are formed to have their large areas, the first pads 20 may be over-etched. According to the present example inventive concepts, as the second pads 40 are formed to have their large thicknesses, in a bonding process of the lower and upper structures 10 and 30, the second pads 40 may have large expansion distances toward the first pads 20, and the second pads 40 may be easily bonded to the first pads 20. Accordingly, the first pads 20 and the second pads 40 may be prevented from contact failure (or short) due to the over-etching of the first pads 20. In conclusion, defects may occur less frequently in a semiconductor fabrication process.

In a semiconductor device according to some example embodiments of the present inventive concepts, even if lower and upper structures are misaligned due to failure of semiconductor fabrication process, a constant contact area may be provided between pads. For example, the pads may have a uniform contact resistance. Accordingly, the semiconductor device may increase in electrical properties.

According to some embodiments of the present inventive concepts, it may be possible to obtain a constant area of a pad overlapping region while minimizing an effect of misalignment between lower and upper structures. Even when alignment of pads is slightly poor, a constant bonding area may be obtained between the pads.

In a method of fabricating a semiconductor device according to some example embodiments of the present inventive concepts, a contact area between pads may be constant even if lower and upper structures are misaligned due to process error when the lower and upper structures are bonded to each other. In addition, the pads may be easily bonded to each other in a bonding process of the lower and upper structures. Accordingly, the pads may be prevented from contact failure caused by the fact that the pads are over-etched. In conclusion, defects may less occur in semiconductor fabrication process.

Although the present example inventive concepts have been described in connection with some example embodiments of the present inventive concepts illustrated in the accompanying drawings, it will be understood by one of ordinary skill in the art that variations in form and detail may be made therein without departing from the spirit and essential feature of the present inventive concepts. The above disclosed example embodiments should thus be considered illustrative and not restrictive.

What is claimed is:

1. A semiconductor device, comprising:
a lower structure; and
an upper structure,
wherein the lower structure includes:
a first semiconductor substrate;
a first pad on the first semiconductor substrate; and
a first dielectric layer that surrounds the first pad on the first semiconductor substrate,
wherein the upper structure includes:
a second semiconductor substrate;
a second pad on the second semiconductor substrate; and
a second dielectric layer that surrounds the second pad on the second semiconductor substrate,
wherein the upper structure and the lower structure are bonded to each other to allow the first pad and the second pad to come into contact each other and to allow the first dielectric layer and the second dielectric layer to come into contact each other,
wherein a first interface between the first pad and the second pad is at a level different from a level of a second interface between the first dielectric layer and the second dielectric layer,
wherein a first area of the first pad is greater than a second area of the second pad, and
wherein a second thickness of the second pad is different from a first thickness of the first pad.

2. The semiconductor device of claim 1, wherein, when viewed in a plan view, an entirety of the second pad overlaps at least a portion of the first pad.

3. The semiconductor device of claim 1, wherein the second thickness of the second pad is greater than the first thickness of the first pad, and the first interface is closer than the second interface to the first semiconductor substrate.

4. The semiconductor device of claim 3, wherein the first pad has a first recess directed toward the first semiconductor substrate from a top surface of the first dielectric layer, and the second pad is inserted into the first recess to come into contact with the first pad.

5. The semiconductor device of claim 3, wherein the second thickness of the second pad is about 1.5 times to about 3 times the first thickness of the first pad.

6. The semiconductor device of claim 1, wherein the first thickness of the first pad is greater than the second thickness of the second pad, and the second interface is closer than the first interface to the first semiconductor substrate.

7. The semiconductor device of claim 6, wherein the second pad has a second recess directed toward the second semiconductor substrate from a bottom surface of the second dielectric layer, and the first pad is inserted into the second recess to come into contact with the second pad.

8. The semiconductor device of claim 1, wherein the first area of the first pad is about 1.5 times to about 2 times the second area of the second pad.

9. The semiconductor device of claim 1, wherein the first pad and the second pad include copper (Cu), and the first dielectric layer and the second dielectric layer include oxide, nitride, or oxynitride of a material included in the first and second semiconductor substrates.

10. The semiconductor device of claim 1, wherein each of the first and second pads has a circular planar shape or a rectangular planar shape.

11. The semiconductor device of claim 10, wherein a width of the first pad is in a range of about 2 μm to about 30 μm.

12. The semiconductor device of claim 1, wherein the first pad has a rectangular planar shape or a linear planar shape, the second pad has a rectangular planar shape or a linear planar shape, and when viewed in a plan view, the first pad and the second pad are disposed in a cross shape where the first pad and the second pad intersect each other.

13. A semiconductor device, comprising:
a lower structure including a first circuit pattern on a first substrate, a first dielectric layer that covers the first circuit pattern on the first substrate, and a first pad that is exposed on the first dielectric layer and is connected to the first circuit pattern; and
an upper structure including a second circuit pattern on a second substrate, a second dielectric layer that covers the second circuit pattern on the second substrate, and a second pad that is exposed on the second dielectric layer and is connected to the second circuit pattern,
wherein a top surface of the first pad has a recess directed toward the first substrate,
wherein a portion of the second pad extends into the recess to come into contact with the first pad, and the first pad and the second pad constitute a single unitary body formed of a same material, and
wherein a second thickness of the second pad is greater than a first thickness of the first pad.

14. The semiconductor device of claim 13, wherein a first interface between the first pad and the second pad is closer to the first substrate than a second interface between the first dielectric layer and the second dielectric layer.

15. The semiconductor device of claim 13, wherein a first area of the first pad is greater than a second area of the second pad.

16. The semiconductor device of claim 13, wherein, when viewed in a plan view, an entirety of the second pad overlaps at least a portion of the first pad.

17. The semiconductor device of claim 13, further comprising:
- a memory cell array in the lower structure, wherein the memory cell array includes a plurality of cell strings including a plurality of memory cells, a plurality of word lines connected to corresponding memory cells, a plurality of bit lines connected to corresponding sides of the cell strings, and a ground selection line connected to the cell strings;
- a control circuit in the upper structure, wherein the control circuit includes a free charge control circuit that controls ones of the cell strings and controls a plurality of data program steps for the memory cells; and
- a row decoder in the upper structure, wherein in response to control of the control circuit, the row decoder activates at least one of the word lines.

18. A method of fabricating a semiconductor device, the method comprising:
- providing a lower structure that includes a first semiconductor substrate, a first pad on the first semiconductor substrate, and a first dielectric layer surrounding the first pad on the first semiconductor substrate;
- performing a planarization process on the first pad and the first dielectric layer, a recess being formed on a top surface of the first pad after the planarization process, the recess being at a level lower than a level of a top surface of the first dielectric layer;
- providing an upper structure that includes a second semiconductor substrate, a second pad on the second semiconductor substrate, and a second dielectric layer surrounding the second pad on the second semiconductor substrate;
- causing the upper structure and the lower structure to contact each other to allow the first pad and the second pad to vertically align with each other and to allow the first dielectric layer and the second dielectric layer to be coupled to each other; and
- performing an annealing process on the upper structure and the lower structure,
- wherein, during the annealing process, the second pad expands toward the first pad so as to fill the recess, and the second pad and the first pad are brought into contact and bonded to each other.

19. The method of claim 18, wherein
a first area of the first pad is greater than a second area of the second pad, and
a second thickness of the second pad is greater than a first thickness of the first pad.

20. The method of claim 18, wherein a first interface between the first pad and the second pad is closer to the first semiconductor substrate than a second interface between the first dielectric layer and the second dielectric layer.

* * * * *